United States Patent
Jiang et al.

(10) Patent No.: US 10,003,415 B1
(45) Date of Patent: Jun. 19, 2018

(54) METHOD TO REMOVE MEASUREMENT RECEIVER COUNTER INTERMODULATION DISTORTION FOR TRANSMITTER CALIBRATION

(71) Applicant: Futurewei Technologies, Inc., Plano, TX (US)

(72) Inventors: Hong Jiang, Kernersville, NC (US); Zhihang Zhang, Cary, NC (US); Wael Al-Qaq, Oak Ridge, NC (US)

(73) Assignee: Futurewei Technologies, Inc., Plano, TX (US)

( * ) Notice: Subject to any disclaimer, the term of this patent is extended or adjusted under 35 U.S.C. 154(b) by 0 days. days.

(21) Appl. No.: 15/404,142

(22) Filed: Jan. 11, 2017

Related U.S. Application Data (60) Provisional application No. 62/436,363, filed on Dec. 19, 2016.

(51) Int. Cl.
| | |
|---|---|
| *H04B 17/11* | (2015.01) |
| *H04L 27/36* | (2006.01) |
| *H03K 3/017* | (2006.01) |
| *H04B 1/04* | (2006.01) |
| *H04B 15/06* | (2006.01) |

(52) U.S. Cl.
CPC ............ *H04B 17/11* (2015.01); *H03K 3/017* (2013.01); *H04L 27/364* (2013.01); *H04B 1/0475* (2013.01); *H04B 15/06* (2013.01)

(58) Field of Classification Search
CPC ...... H04B 17/11; H04B 1/0475; H04B 15/06; H04L 27/264; H03K 3/017
See application file for complete search history.

(56) References Cited

U.S. PATENT DOCUMENTS

| | | | | |
|---|---|---|---|---|
| 8,260,223 B2* | 9/2012 | He | ................. | H03D 7/1441 |
| | | | | 455/120 |
| 9,160,461 B2* | 10/2015 | Hwang | ................. | H04B 15/00 |
| 9,236,960 B1* | 1/2016 | Tinella | ................. | H04B 17/00 |

(Continued)

OTHER PUBLICATIONS

Chen, Y.-H. et al., "An LTE SAW-less Transmitter using 33% Duty-Cycle LO Signals for Harmonic Suppression," MediaTek, International Solid-State Circuits Conference, 2015, pp. 1-20.

*Primary Examiner* — Sophia Vlahos
(74) *Attorney, Agent, or Firm* — Zilka-Kotab, PC (57) ABSTRACT

A system, computer readable medium, and method are provided for calibrating a wireless transmitter. A transceiver that includes a radio frequency transmitter, a measurement receiver, and a local oscillator unit may be calibrated by adjusting the duty cycle of the radio frequency signals generated by the local oscillator unit. The method for calibrating the wireless transmitter includes the steps of collecting measurement data corresponding to a number of pre-defined duty ratio correction factors, calculating estimated optimum duty ratio correction factors based on the measurement data, and determining a final optimum duty ratio correction factor from the estimated optimum duty ratio correction factors. The pre-defined duty ratio correction factors may be selected to simplify the calculations for choosing the final optimum duty ratio correction factor. The wireless transmitter can be calibrated by configuring the local oscillator unit based on the final optimum duty ratio correction factor.

20 Claims, 7 Drawing Sheets

(56) References Cited

U.S. PATENT DOCUMENTS

2012/0046005 A1* 2/2012 Simmons ............. H03K 3/0307
                                                    455/120
2017/0302308 A1* 10/2017 Jiang .................... H04B 1/0475

* cited by examiner

METHOD TO REMOVE MEASUREMENT RECEIVER COUNTER INTERMODULATION DISTORTION FOR TRANSMITTER CALIBRATION

CROSS-REFERENCE TO RELATED APPLICATIONS

This application claims the benefit of U.S. Provisional Patent Application No. 62/436,363 filed Dec. 19, 2016, the entire contents of which are incorporated herein by reference.

FIELD OF THE INVENTION

The present invention relates to radio communications, and more particularly to calibration of radio transmitters.

BACKGROUND

Radio frequency (RF) communication and, more specifically, high-speed wireless network communication in cellular baseband frequencies are ubiquitous in today's consumer electronic devices. Wireless terminals include not only cellular phones, but other consumer electronic devices that include chipsets that implement wireless transmitters and/or receivers. Long-Term Evolution (LTE) is a standard for high speed wireless communication, and many chipsets are designed to meet the LTE standard. The counter intermodulation (CIM) performance of the wireless terminal transmitter path is a key parameter for the design of these devices. In order to achieve a low CIM distortion level, calibration of the transmitter is often required, especially for a multi-phase mixer transceiver architecture.

Figure 1:
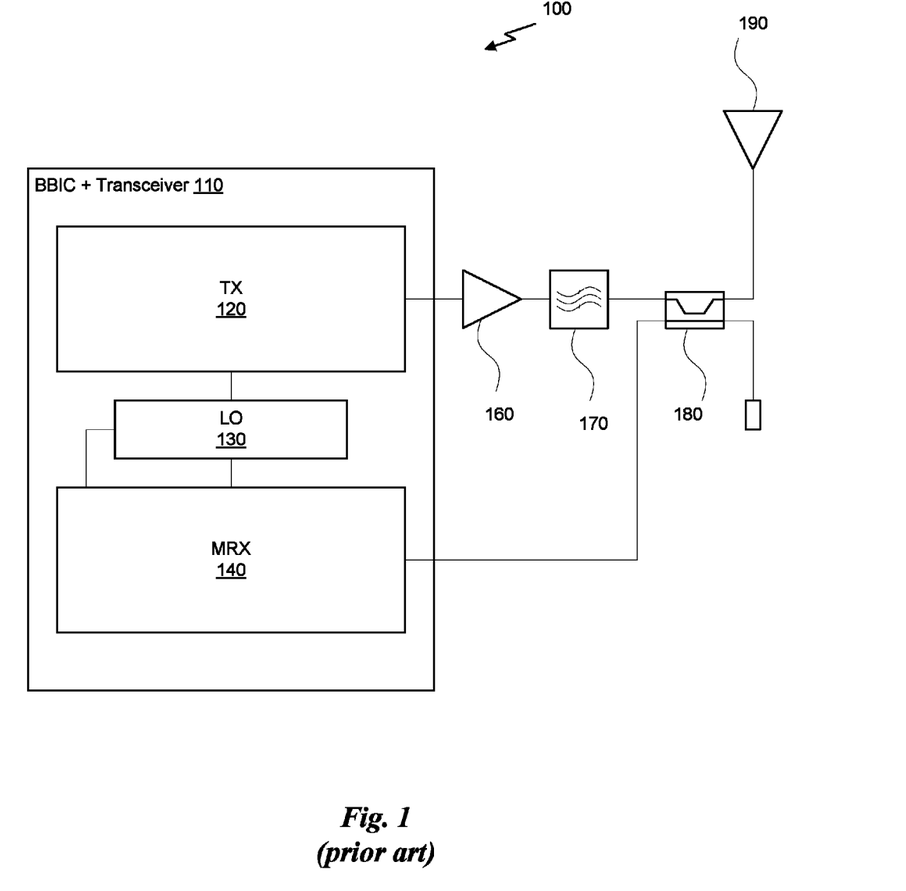
FIG. 1 illustrates a wireless communications system, in accordance with the prior art.

FIG. 1 illustrates a wireless communications system 100, in accordance with the prior art. As shown in FIG. 1, the wireless communications system 100 includes a baseband integrated circuit and transceiver 110 that includes a transmitter (TX) 120, a local oscillator 130, and a measurement receiver (MRX) 140. The transmitter 120 generates an output signal that is coupled to a power amplifier 160. The power amplifier 160 generates an amplified signal that is passed through a bandpass filter 170, a coupler 180, and one or more antenna 190. The coupler 180 couples the signal output from the bandpass filter 170 to a feedback signal that is connected to the input of the measurement receiver 140. In effect, the feedback signal is the same as the filtered, amplified signal transmitted wirelessly by the antenna 190.

Calibration of the transmitter 120 is typically performed using the measurement receiver 140, which is configured to measure the RF signal generated by the transmitter 120. Analysis of the measured signal may be performed to determine adjustments for one or more parameters of the transmitter that affect the CIM distortion level. One parameter that is often adjusted is a duty cycle of the RF signals generated by the local oscillator 130 that feeds an N-phase mixer in the transmitter 120. By varying the one or more parameters and measuring a CIM distortion level of the output signal, the measurement receiver 140 may be utilized to calibrate the transmitter 120 by choosing parameter values that provide an optimum reduction in CIM distortion in the output signal.

Unfortunately, the measurement receiver path may also create CIM distortion that is added to the CIM distortion from the transmitter during the analysis. The CIM distortion from the measurement receiver path may come from various sources including but not limited to, e.g., power amplifier harmonics mixing with the measurement receiver local oscillator signal or harmonic distortion from an analog-to-digital converter (ADC) that converts the feedback signal to digital samples. The CIM distortion generated along the measurement receiver path from the coupler 180 to the measurement receiver 140 can affect the analysis of the feedback signal such that the parameter values selected during calibration do not minimize the CIM distortion of the transmitter 120. There are various work arounds to this issue. For example, the voltage controlled oscillator clock speed may be increased, but this may increase power consumption of the system. An additional low pass filter between the coupler 180 and the measurement receiver 140 may attenuate certain CIM distortion that negatively affects calibration, and the design of the measurement receiver may be ultra linear to minimize CIM distortion from the measurement receiver, which may be achieved at the cost of more complicated circuit design. Thus, there is a need for addressing this issue and/or other issues associated with the prior art.

SUMMARY

A system, computer readable medium, and method are provided for calibrating a wireless transmitter. A transceiver that includes a radio frequency transmitter, a measurement receiver, and a local oscillator unit may be calibrated by adjusting the duty cycle of the radio frequency signals generated by the local oscillator unit. The method for calibrating the wireless transmitter includes the steps of collecting measurement data corresponding to a number of pre-defined duty ratio correction factors, calculating estimated optimum duty ratio correction factors based on the measurement data, and determining a final optimum duty ratio correction factor from the estimated optimum duty ratio correction factors. The pre-defined duty ratio correction factors may be selected to simplify the calculations for choosing the final optimum duty ratio correction factor. The wireless transmitter can be calibrated by configuring the local oscillator unit based on the final optimum duty ratio correction factor.

In a first embodiment, the number of pre-defined duty ratio correction factors is four, referred to as $x_1$, $x_2$, $x_3$, and $x_4$.

In a second embodiment (which may or may not be combined with the first embodiment), a first pre-defined duty ratio correction factor, $x_1$, is equal in magnitude and opposite in sign to a second pre-defined duty ratio correction factor, $x_2$, (i.e., $x_2 = -x_1$). In addition, a third pre-defined duty ratio correction factor, $x_3$, is less than the first pre-defined duty ratio correction factor, $x_1$, and greater than a fourth pre-defined duty ratio correction factor, $x_4$, which is equal to zero (i.e., $x_1 > x_3 > x_4 = 0$).

In a third embodiment (which may or may not be combined with the first and/or second embodiments), the two estimated optimum duty ratio correction factors are calculated by: (1) calculating a difference between a first measurement vector associated with a first pre-defined duty ratio correction factor, $x_1$, and a second measurement vector associated with a second pre-defined duty ratio correction factor, $x_2$; and (2) calculating a difference between the first measurement vector associated with the first pre-defined duty ratio correction factor, $x_1$, and a third measurement vector associated with a third pre-defined duty ratio correction factor, $x_3$.

In a fourth embodiment (which may or may not be combined with the first, second, and/or third embodiments), the four estimated optimum duty ratio correction factors are calculated by: (1) calculating a difference between the first measurement vector associated with the first pre-defined duty ratio correction factor, $x_1$, and a fourth measurement vector associated with a fourth pre-defined duty ratio correction factor, $x_4$; and (2) calculating a difference between the second measurement vector associated with the second pre-defined duty ratio correction factor, $x_2$, and the fourth measurement vector associated with the fourth pre-defined duty ratio correction factor, $x_4$.

In a fifth embodiment (which may or may not be combined with the first, second, third, and/or fourth embodiments), determining the final optimum duty ratio correction factor from the six estimated optimum duty ratio correction factors comprises calculating a set of difference values and determining a minimum absolute difference value based on the magnitudes of the set of difference values. The difference values include: (1) a first difference value between a first estimated optimum duty ratio correction factor calculated during the first iteration and a first estimated optimum duty ratio correction factor calculated during the second iteration (i.e., $x_{0n\_2nd\_p} - x_{0n\_1st}$); (2) a second difference value between the first estimated optimum duty ratio correction factor calculated during the first iteration and a second estimated optimum duty ratio correction factor calculated during the second iteration (i.e., $x_{0n\_2nd\_n} - x_{0n\_1st}$); (3) a third difference value between a second estimated optimum duty ratio correction factor calculated during the first iteration and a third estimated optimum duty ratio correction factor calculated during the second iteration (i.e., $x_{0p\_2nd\_p} - x_{0p\_1st}$); and (4) a fourth difference value between the second estimated optimum duty ratio correction factor calculated during the first iteration and a fourth estimated optimum duty ratio correction factor calculated during the second iteration (i.e., $x_{0p\_2nd\_n} - x_{0p\_1st}$).

In a sixth embodiment (which may or may not be combined with the first, second, third, fourth, and/or fifth embodiments), configuring the local oscillator unit associated with the wireless transmitter based on the final optimum duty ratio correction factor comprises writing a value of the final optimum duty ratio correction factor to a register associated with the local oscillator unit.

In a seventh embodiment (which may or may not be combined with the first, second, third, fourth, fifth, and/or sixth embodiments), the wireless transmitter, the local oscillator unit, and the measurement receiver are included in a transceiver implemented on an integrated circuit.

In an eighth embodiment (which may or may not be combined with the first, second, third, fourth, fifth, sixth, and/or seventh embodiments), the logic is implemented as a plurality of instructions executed by a processor implemented on a second integrated circuit, separate and distinct from the integrated circuit that includes the wireless transmitter, the local oscillator unit, and the measurement receiver included within a transceiver.

In a ninth embodiment (which may or may not be combined with the first, second, third, fourth, fifth, sixth, seventh, and/or eighth embodiments), the wireless transmitter and the measurement receiver are configured to operate using in-phase quadrature (IQ) modulation.

To this end, in some optional embodiments, one or more of the foregoing features of the aforementioned apparatus, system, and/or method may afford a more accurate technique for calibrating a wireless transmitter that, in turn, may enable lower power consumption of the wireless transmitter device and/or reduce CIM distortion in the radio frequency signal generated by the device. It should be noted that the aforementioned potential advantages are set forth for illustrative purposes only and should not be construed as limiting in any manner.

DETAILED DESCRIPTION

Adjusting the duty cycle of the RF signals generated by the local oscillator unit changes the CIM distortion in the output signals of the wireless transmitter in a drastic way. However, the CIM distortion of the signal measured by the measurement receiver may show very little change when the CIM distortion from the components of the measurement receiver is the major contributing source of said CIM distortion. The constant CIM distortion term from the components of the measurement receiver path (i.e., the path from the coupler to the measurement receiver) can be subtracted out of the feedback signal, which means that the CIM distortion from the components of the transmitter path (i.e., the components from the transmitter to the coupler) can be measured more accurately. By measuring the CIM distortion from the components of the transmitter path more accurately, a more accurate calibration of the transmitter may be achieved as the duty cycle of the RF signals generated by the local oscillator unit can be varied according to the measured CIM distortion from the components of the transmitter path alone.

Measurement data may be collected from the measurement receiver for a number of pre-defined duty ratio correction factors that identify adjustments to a duty cycle of one or more RF signals generated by the local oscillator unit. These measurements may be used to determine an optimum duty ratio correction factor for the local oscillator unit. It will be appreciated that absolute differences in the measurement vectors may be relied on because, for small changes in the duty cycle of the RF signals, the CIM distortion from the components of the measurement receiver path are constant and, therefore, will cancel out when the difference of two separate measurement vectors is calculated. The estimates for the optimum duty ratio correction factor, therefore, rely predominantly on the measured CIM distortion from the components of the transmitter path.

Figure 2:
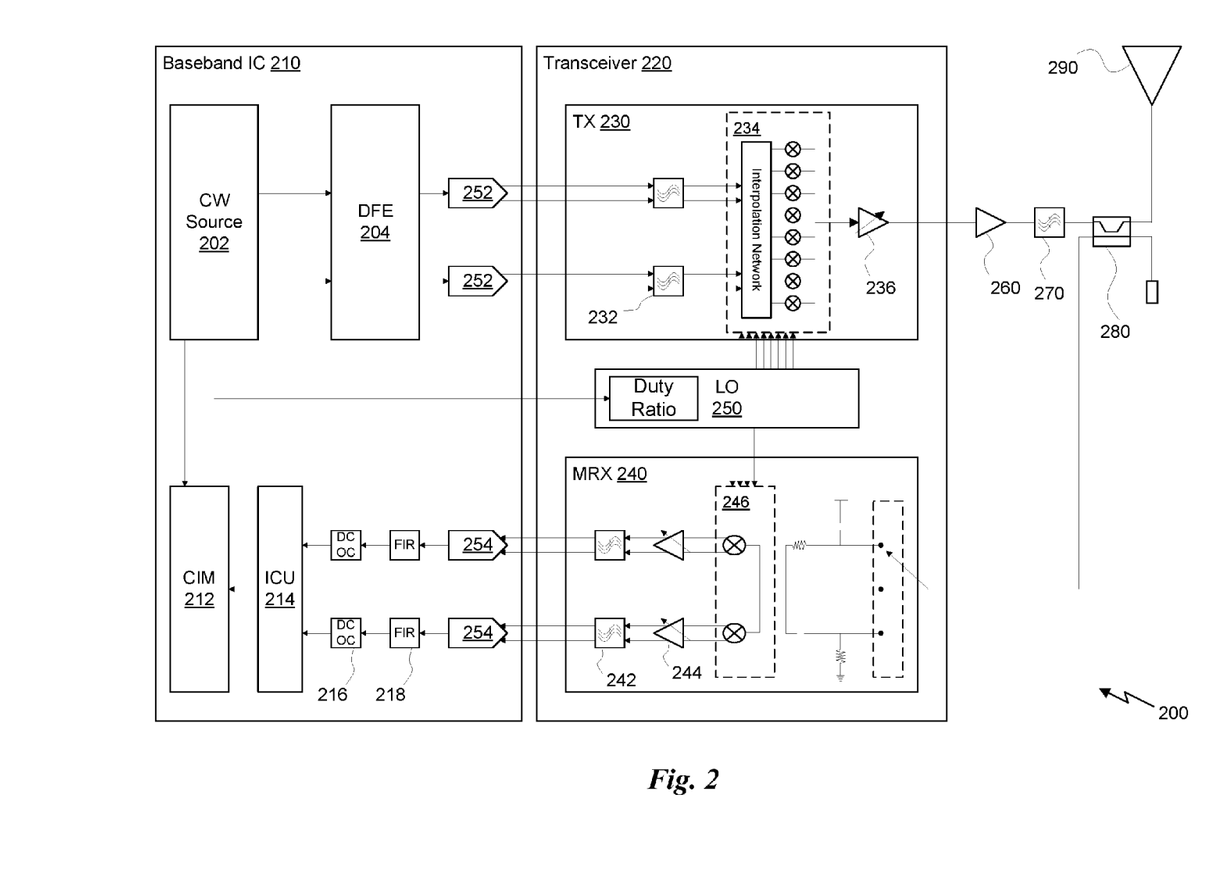
FIG. 2 illustrates a wireless communications system, in accordance with one embodiment.

FIG. 2 illustrates a wireless communications system 200, in accordance with one embodiment. As shown in FIG. 2, the wireless communication system 200 includes a baseband integrated circuit (IC) 210, a transceiver 220, a power amplifier 260, a passband filter 270, a coupler 280, and an antenna 290. The baseband IC 210 includes a continuous waveform (CW) source 202, a digital front end (DFE) 204, a pair of digital-to-analog converters (DAC) 252, a CIM optimum code estimator unit 212, an image correction unit (ICU) 214, a pair of direct current (DC) offset correction (DCOC) units 216, a pair of finite impulse response (FIR) filters 218, and a pair of analog-to-digital converters (ADC) 254. The transceiver 220 includes a transmitter (TX) 230, a local oscillator (LO) unit 250, and a measurement receiver (MRX) 240. The transmitter 230 includes a pair of low-pass filters (LPF) 232, an 8-phase mixer 234, and a variable gain amplifier (VGA) 236. The measurement receiver 240 includes a passive RC network, a 4-phase mixer 246, a pair of programmable gain amplifiers (PGA) 244, and a pair of low-pass filters (LPF) 242. The passive RC network enables the received feedback signal to be passed through a high-pass filter (HPF), no filter, or a low-pass filter (LPF) which results in a phase shift of −45°, 0°, or +45°, respectively. The LO unit 250 includes a duty ratio adjustment capability. In one embodiment, the LO unit 250 includes a register that may be written to specify a duty ratio correction factor that adjusts the duty ratio of the carrier signals coupled to the N-phase mixers of the transmitter 230 and the measurement receiver 250.

The CW source 202 generates discrete intermediate frequency (IF) (i.e., baseband) waveforms for modulating a signal for wireless transmission. In one embodiment, the CW source 202 may generate two waveforms for In-phase Quadrature (I/Q) modulation: (1) an I waveform; and (2) a Q waveform. These waveforms are passed to the DFE 204 that may process the waveforms before transmitting the waveforms to a pair of DACs 252. As shown, the DACs 252 generate a differential current output that is passed to the transmitter 230 to be transmitted wireless at a particular carrier frequency. The DAC 252 output is passed through a low-pass filter 232 to attenuate any high-frequency distortion in the analog signal produced by the components of the baseband IC 210. The filtered signals are received at the 8-phase mixer 234, which also receives eight phase-shifted RF signals generated by the LO unit 250. In one embodiment, each RF signal generated by the LO unit 250 is a fixed frequency sine wave that is shifted by 45°. The mixer 234 modulates the RF signals at each of the different phases and combines the signals to produce an outputs signal that is passed through a VGA 236 to amplify the signal for output to the components not included in the integrated circuit of the transceiver 220.

Similar to the wireless communications system 100 of FIG. 1, the output signal is passed to a power amplifier 260, a bandpass filter (BPF) 270, and a coupler 280, and one or more antenna 290. A feedback signal is routed from the coupler 280 back to an input of the measurement receiver 240. The feedback signal is passed through the passive RC network and then to the 4-phase mixer 246. The feedback signal is mixed with four RF signals from the LO unit 250 to generate differential outputs for I and Q components within the feedback signal. The differential outputs are passed through the PGAs 244 and LPFs 242 before being passed to the ADCs 254 of the baseband IC 210. The I and Q components of the feedback signal are sampled in a digital domain and passed through the FIR filters 218 and DCOC units 216 before finally being processed by the ICU 214.

The baseband IC 210 is an integrated circuit in a digital domain that generates signals for the transmitter 230 and analyzes signals from the measurement receiver 240 of the transceiver. The transceiver 220 is an integrated circuit in an analog domain that generates an RF signal for wireless transmission via the antenna 290 and provides a feedback path for measuring the RF signal. Although the baseband IC 210 and the transceiver 220 are shown as separate and distinct ICs in FIG. 2, in alternative embodiments, the baseband IC 210 and transceiver 220 may be embodied on a single IC, in a similar manner to the wireless communications system 100 in FIG. 1.

Many of the components included in communications system 200, and the operation thereof, are well-known in the art. However, the CIM optimum code estimator unit 212 is a new component that is configured to determine an optimal duty ratio correction factor when calibrating the transmitter 230. In one embodiment, the CIM optimum code estimator unit 212 is a hardware unit configured to make particular measurements of the feedback signal and determine the optimum duty ratio correction factor for the LO unit 250. In another embodiment, the CIM optimum code estimator unit 212 is a software module that executes instructions configured to make particular measurements of the feedback signal and determine the optimum duty ratio correction factor for the LO unit 250.

The CIM distortion (e.g., $3^{rd}$ order intermodulation products—CIM3, $5^{th}$ order intermodulation products—CIM5, etc) generated by the TX clk (i.e., RF signals from the LO unit 250) in the 8-phase mixer 234 is strongly dependent of the duty cycle error of the TX clk due to non-perfect clock harmonics cancellation. However, the duty cycle error does not vary significantly within the output signal itself or the output signal harmonics (e.g., 3*fLO+3*fbb), which means the feedback signal is mostly a fixed signal, which leads to the CIM distortion from the measurement receiver path also being fixed while the duty cycle of the RF signals generated by the LO unit 250 is adjusted. In other words, duty cycle error in the RF signals generated by the LO unit 250 may be due to manufacturing defects in the LO unit 250 in the IC of the transceiver 220, which can be corrected, at least partially, by adjusting the duty cycle by a duty ratio correction factor. Adjustment of this duty ratio correction factor significantly changes the CIM distortion from the TX path, while not significantly affecting the CIM distortion for the MRX path.

Figure 3A:
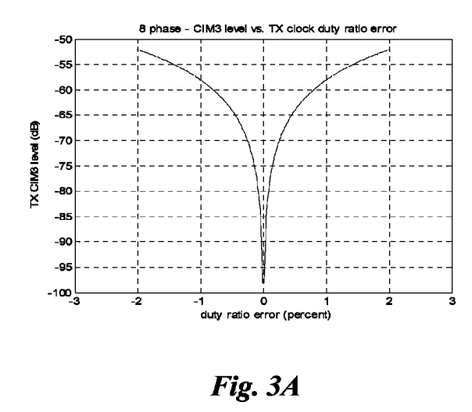
FIGS. 3A and 3B illustrate the CIM distortion from the transmitter path and measurement receiver path, respectively, with respect to the duty cycle error, in accordance with one embodiment.
Figure 3B:
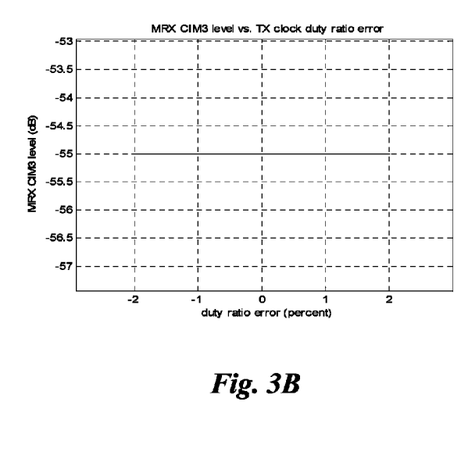

FIGS. 3A and 3B illustrate the CIM distortion from the TX path and MRX path, respectively, with respect to the duty cycle error, in accordance with one embodiment. As shown in FIG. 3A, the CIM distortion from the TX path is minimized when the duty cycle error is zero. However, as shown in FIG. 3B, the CIM distortion from the MRX path is constant and does not vary based on the duty cycle error. As shown in FIG. 3A, the CIM distortion level of the TX path may go from approximately −50 dB at duty cycle errors of approximately 2 percent to approximately −100 dB at duty cycle errors of 0 percent. In comparison, as shown in FIG. 3B, the CIM distortion level from the MRX path may be a constant −55 dB, across a range of duty cycle error of [−2, 2] percent.

Utilizing the strong/weak dependency characteristics of different contributors to CIM distortion levels, multiple measurements can be made to remove the non-TX path contributors so that the TX path contributors can be measured properly. In order to remove the non-TX path contributors to CIM distortion, four measurements must be taken, as shown in Equations 1 through 4:

$$A_1 * e^{i\varphi} + B * e^{i\theta} = M_1 * e^{i\Theta_1} \quad \text{(Eq. 1)}$$

$$A_2 * e^{i\varphi} + B * e^{i\theta} = M_2 * e^{i\Theta_2} \quad \text{(Eq. 2)}$$

$$A_3 * e^{i\varphi} + B * e^{i\theta} = M_3 * e^{i\Theta_3} \quad \text{(Eq. 3)}$$

$$A_4 * e^{i\varphi} + B * e^{i\theta} = M_4 * e^{i\theta_4} \quad \text{(Eq. 4)}$$

where $A_n * e^{i\varphi}$ is the TX clk, non-perfect duty cycle related CIM3 term, $B * e^{i\theta}$ is the combined result of all other contributors' CIM3 term, and $M_n * e^{i\theta_n}$ is the measurement vector. A measurement vector refers to an IQ signal decoded from the feedback signal measured by the measurement receiver 240. The coefficient $A_n$ in the TX clk, non-perfect duty cycle related CIM3 term can be written as:

$$A_n = \sqrt{a^{2*}(x_n - x_0)^2} = |a*(x_n - x_0)| \quad \text{(Eq. 5)}$$

where a is a scaling coefficient and $x_n$ is a pre-defined duty ratio correction factor.

Assuming that the duty ratio correction factor is small (i.e., the adjustment of the duty cycle is small), $\varphi$ and $B * e^{i\varphi}$ may be approximated as constants. Then, by combining Equations 1 through 5, Equations 6 through 9 may be derived:

$$||a*(x_1 - x_0)| - |a*(x_2 - x_0)|| = |N_{12}| \quad \text{(Eq. 6)}$$

$$||a*(x_1 - x_0)| - |a*(x_3 - x_0)|| = |N_{13}| \quad \text{(Eq. 7)}$$

$$||a*(x_1 - x_0)| - |a*(x_4 - x_0)|| = |N_{14}| \quad \text{(Eq. 8)}$$

$$||a*(x_2 - x_0)| - |a*(x_4 - x_0)|| = |N_{24}| \quad \text{(Eq. 9)}$$

where:

$$|N_{12}| = |M_1 * e^{i\theta_1} - M_2 * e^{i\theta_2}| \quad \text{(Eq. 10)}$$

$$|N_{13}| = |M_1 * e^{i\theta_1} - M_3 * e^{i\theta_3}| \quad \text{(Eq. 11)}$$

$$|N_{14}| = |M_1 * e^{i\theta_1} - M_4 * e^{i\theta_4}| \quad \text{(Eq. 12)}$$

$$|N_{24}| = |M_2 * e^{i\theta_2} - M_4 * e^{i\theta_4}| \quad \text{(Eq. 13)}$$

The solutions to Equations 10-13 may be obtained by correlating the four measurements collected by the measurement receiver 240. Furthermore, by carefully selecting the duty ratio correction factors for $x_1$, $x_2$, $x_3$, and $x_4$, the math can be simplified as much as possible.

Figure 4:
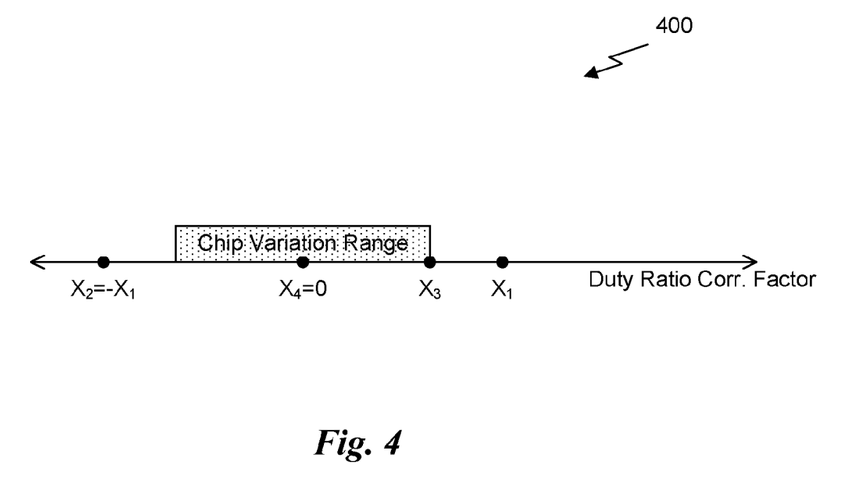
FIG. 4 is a conceptual diagram of the pre-defined duty ratio correction factors for simplifying calculations for determining an optimum duty ratio correction factor, in accordance with one embodiment.

FIG. 4 is a conceptual diagram 400 of the pre-defined duty ratio correction factors for simplifying calculations for determining an optimum duty ratio correction factor, in accordance with one embodiment. As shown in FIG. 4, the duty ratio correction factors $x_1$ and $x_3$ are selected to be outside of the chip variation range with $x_1 > x_3 > 0$. The functional range of correcting the duty cycle of the RF signals generated by the LO unit 250 may be limited to a particular range (e.g., 3 percent). In other words, if the ideal duty cycle of the RF signals generated by the LO unit is 50%, then the variation range of the duty cycle may be limited to between 47% and 53% (or some other defined range) in order to correct for small defects in manufacturing that cause a deviation of the duty cycle from the ideal duty cycle. It will be appreciated that the LO unit 250 may be capable of generating duty cycles outside of this variation range in order to collect measurement data, but the actual duty ratio correction factor utilized for calibrating the transmitter 230 may simply be limited to this arbitrary range. Having to correct the duty cycle outside of this range may mean that the chip is out of spec and should be rejected. Furthermore, it may be pre-defined that the duty ratio correction factor $x_2 = -x_1$ and the duty ratio correction factor $x_4 = 0$, in order to simplify calculations required during calibration. The coefficient a and two possible solutions for the duty ratio correction factors $x_0$ can be solved from Equations 6 and 7 as:

$$a = \left| \frac{|N_{13}|}{(x_1 - x_3)} \right| \quad \text{(Eq. 14)}$$

$$x_{0p\_1st} = \left[ (x_1 + x_2) + \frac{|N_{12}|}{a} \right] * 0.5 \quad \text{(Eq. 15)}$$

$$x_{0n\_1st} = \left[ (x_1 + x_2) - \frac{|N_{12}|}{a} \right] * 0.5 \quad \text{(Eq. 16)}$$

The duty ratio correction factors $x_0$ represents the optimum duty ratio correction factor, which may be solved for iteratively. Equations 15 and 16 can be simplified if $x_2 = -x_1$ because the first terms are equal to zero, such that:

$$x_{0p\_1st} = \left[ + \frac{|N_{12}|}{a} \right] * 0.5 \quad \text{(Eq. 17)}$$

$$x_{0n\_1st} = \left[ - \frac{|N_{12}|}{a} \right] * 0.5 \quad \text{(Eq. 18)}$$

Solving Equation 9 under the assumption that $x_4 = 0$ yields the following logic. If the optimum duty ratio correction factor is a negative value ($x_{0n\_1st}$), then a second iteration estimate of the optimum duty ratio correction factor is given by:

$$x_{0n\_2nd\_p} = \left[ x_2 - \frac{|N_{24}|}{a} \right] * 0.5 \quad \text{(Eq. 19)}$$

$$x_{0n\_2nd\_n} = \left[ x_2 - \frac{|N_{24}|}{a} \right] * 0.5 \quad \text{(Eq. 20)}$$

However, if the optimum duty ration correction factor is a positive value ($x_{0p\_1st}$), then a second iteration estimate of the optimum duty ratio correction factor is given by:

$$x_{0n\_2nd\_p} = \left[ x_1 - \frac{|N_{14}|}{a} \right] * 0.5 \quad \text{(Eq. 21)}$$

$$x_{0n\_2nd\_n} = \left[ x_1 - \frac{|N_{14}|}{a} \right] * 0.5 \quad \text{(Eq. 22)}$$

By determining the minimum of the following values: $|x_{0n\_2nd\_p} - x_{0n\_1st}|$, $|x_{0n\_2nd\_n} - x_{0n\_1st}|$, $|x_{0p\_2nd\_p} - x_{0p\_1st}|$, and $|x_{0p\_2nd\_n} - x_{0p\_1st}|$, the corresponding second iteration estimate is selected as the optimum duty ratio correction factor. For example, if the value of $|x_{0n\_2nd\_n} - x_{0n\_1st}|$ is the minimum value, then the duty ratio correction factor $x_{0n\_2nd\_n}$ is the optimum duty ratio correction factor. The second iteration estimate is used rather than the first iteration estimate because it tends to yield better results.

Figure 5:
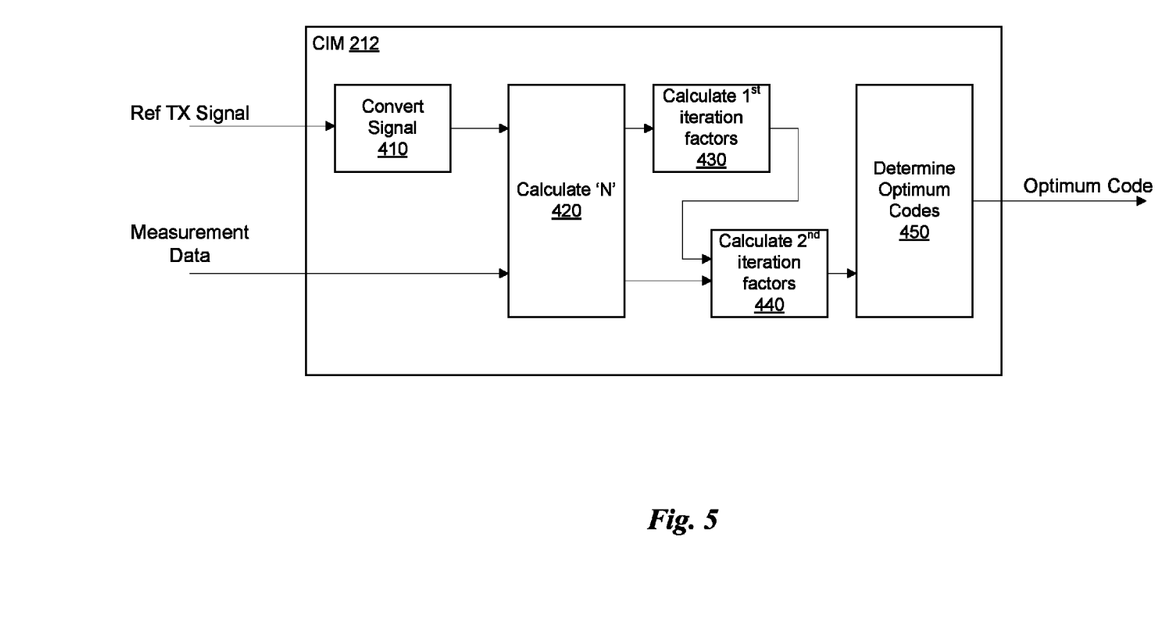
FIG. 5 illustrates the functional blocks of the CIM optimum code estimator unit, in accordance with one embodiment.

FIG. 5 illustrates the functional blocks of the CIM optimum code estimator unit 212, in accordance with one embodiment. The CIM optimum code estimator unit 212 implements logic for determining the optimum duty ratio correction factor (i.e., optimum code). In one embodiment, the logic is implemented in hardware, which performs the functionality of each of the blocks. In another embodiment, the logic is implemented in software, executed by a processor such as a RISC CPU.

As shown in FIG. 5, the functional blocks of the CIM optimum code estimator unit 212 include a first block 410 for converting a reference transmitter signal into a CIM signal. In other words, the reference transmitter signal is analyzed to determine the CIM distortion included in the signal. The reference transmitter signal is received by the CIM optimum code estimator unit 212 from the CW source 202 and represents a clean transmitter signal before CIM distortion is added to the signal by the transmitter 230 and the measurement receiver 240. The functional blocks of the CIM optimum code estimator unit 212 include a second block 420 for calculating the four values of Equations 6 through 9. The second block 420 receives the measurement data from the measurement receiver 240, which has been converted from analog to digital, filtered, and image corrected. At block 430, the duty ratio correction factors $x_{Op\_1st}$ and $x_{On\_1st}$ are calculated using Equations 17 and 18. The second block 420 transmits the values for $|N_{12}|$ and a to the third block 430 for solving these equations. At block 440, the duty ratio correction factors $x_{On\_2nd\_p}$, $x_{On\_2nd\_n}$, $x_{Op\_2nd\_p}$, and $x_{Op\_2nd\_n}$ are calculated using Equations 19 through 22. The second block 420 transmits the values for $|N_{14}|$, $|N_{24}|$ and a to the fourth block 440 for solving these equations. The third block 430 also transmits the values for the duty ratio correction factors $x_{Op\_1st}$ and $x_{On\_1st}$ to the fourth block 440. At block 450, an optimum duty ratio correction factor is determined based on the comparison of these terms: $|x_{On\_2nd\_p} - x_{On\_1st}|$, $|x_{On\_2nd\_n} - x_{On\_1st}|$, $|x_{Op\_2nd\_p} - x_{Op\_1st}|$, and $|x_{Op\_2nd\_n} - x_{Op\_1st}|$. Again, the minimum value of these terms is used to select the corresponding $2^{nd}$ iteration component of those terms as the optimum duty ratio correction factor.

Figure 6:
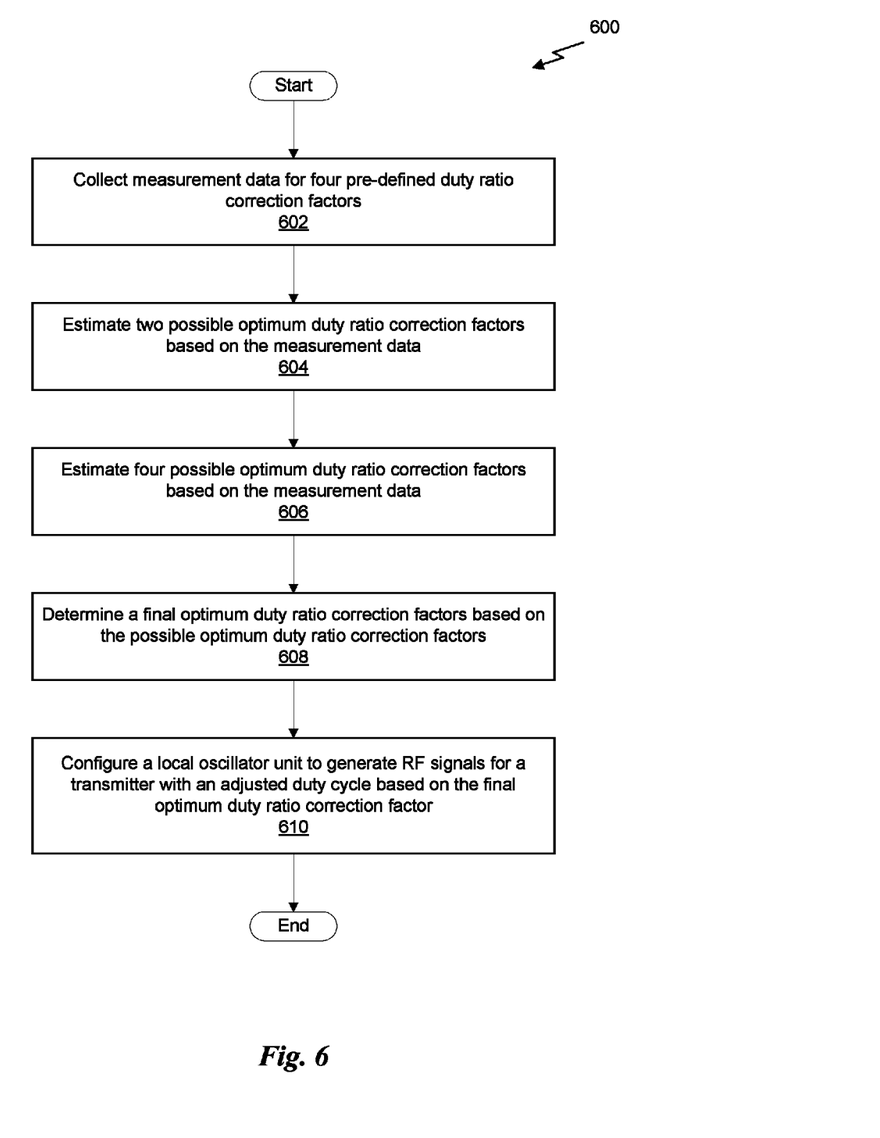
FIG. 6 is a flowchart of a method for calibrating a transmitter, in accordance with one embodiment.

FIG. 6 is a flowchart 600 of a method for calibrating a transmitter, in accordance with one embodiment. At step 602, the measurement receiver 240 is utilized to collect measurement data for four pre-defined duty ratio correction factors ($x_1$, $x_2$, $x_3$, and $x_4$). Although the pre-defined duty ratio correction factors may be arbitrarily selected, calculations may be simplified by defining the duty ratio correction factors such that $x_2 = -x_1$ and $x_4 = 0$. In one embodiment, the CIM optimum code estimator unit 212 configures the LO unit 250 to use one of the four pre-defined duty ratio correction factors to generate RF signals with corrected duty cycles. A known training signal is transmitted by the transmitter 230 using the corrected RF signals, and the measurement receiver 240 is utilized to collect a measurement vector $M_n * e^{j\theta n}$ for that duty ratio correction factor. The process is repeated for the other three pre-defined duty ratio correction factors to collect all four measurements.

At step 604, the measurement data is utilized to estimate two possible optimum duty ratio correction factors $x_{Op\_1st}$ and $x_{On\_1st}$, during a first iteration. In one embodiment, the CIM optimum code estimator unit 212 estimates the magnitude of vectors $|N_{12}|$ and $|N_{13}|$, which are defined as a difference between the measurement vectors corresponding to pairs of pre-defined duty ratio correction factors $x_1$, $x_2$, and $x_3$, through complex correlation between a conjugate signal of CIM3 distortion and the vectors $N_{12}$ and $N_{13}$.

At step 606, the measurement data is utilized to estimate four possible optimum duty ratio correction factors $x_{On\_2nd\_p}$, $x_{On\_2nd\_n}$, $x_{Op\_2nd\_p}$, and $x_{Op\_2nd\_n}$, during a second iteration. In one embodiment, the CIM optimum code estimator unit 212 estimates the magnitude of vectors $|N_{14}|$ and $|N_{24}|$, which are defined as a difference between the measurement vectors corresponding to pairs of pre-defined duty ratio correction factors $x_1$, $x_2$, and $x_4$, through complex correlation between a conjugate signal of CIM3 distortion and the vectors $N_{14}$ and $N_{24}$.

At step 608, the CIM optimum code estimator unit 212 determines a final optimum duty ratio correction factor based on the estimates for the optimum duty ratio correction factors calculated during steps 604 and 606. In one embodiment, the two optimum duty ratio correction factors $x_{Op\_1st}$ and $x_{On\_1st}$ calculated at step 604 are compared to the four optimum duty ratio correction factors $x_{On\_2nd\_p}$, $x_{On\_2nd\_n}$, $x_{Op\_2nd\_p}$, and $x_{Op\_2nd\_n}$ calculated during step 606 in order to determine which optimum duty ratio correction factors calculated during step 606 is the final optimum duty ratio correction factor. More specifically, a difference value is calculated between $x_{Op\_1st}$ and $x_{Op\_2nd\_p}$ as well as between $x_{Op\_1st}$ and $x_{Op\_2nd\_n}$. A difference value is also calculated between $x_{On\_1st}$ and $x_{On\_2nd\_p}$ as well as between $x_{On\_1st}$ and $x_{On\_2nd\_n}$. The minimum of these four difference values is determined and a corresponding term (i.e., one of the optimum duty ratio correction factors $x_{On\_2nd\_p}$, $x_{On\_2nd\_n}$, $x_{Op\_2nd\_p}$, and $x_{Op\_2nd\_n}$ calculated during step 606 utilized to derive that particular difference value) from the minimum difference value is selected as the final optimum duty ratio correction factor.

At step 610, the CIM optimum code estimator unit 212 configures the LO unit 250 to generate RF signals for the transmitter 230 with an adjusted duty cycle based on the final optimum duty ratio correction factor. In one embodiment, the CIM optimum code estimator unit 212 writes the final optimum duty ratio correction factor into a register in the LO unit 250. The transceiver 220 may then be operated in a normal operating mode, generating RF signals at the LO unit 250 based on the final optimum duty ratio correction factor. After step 610, the calibration of the transmitter 230 is complete.

Figure 7:
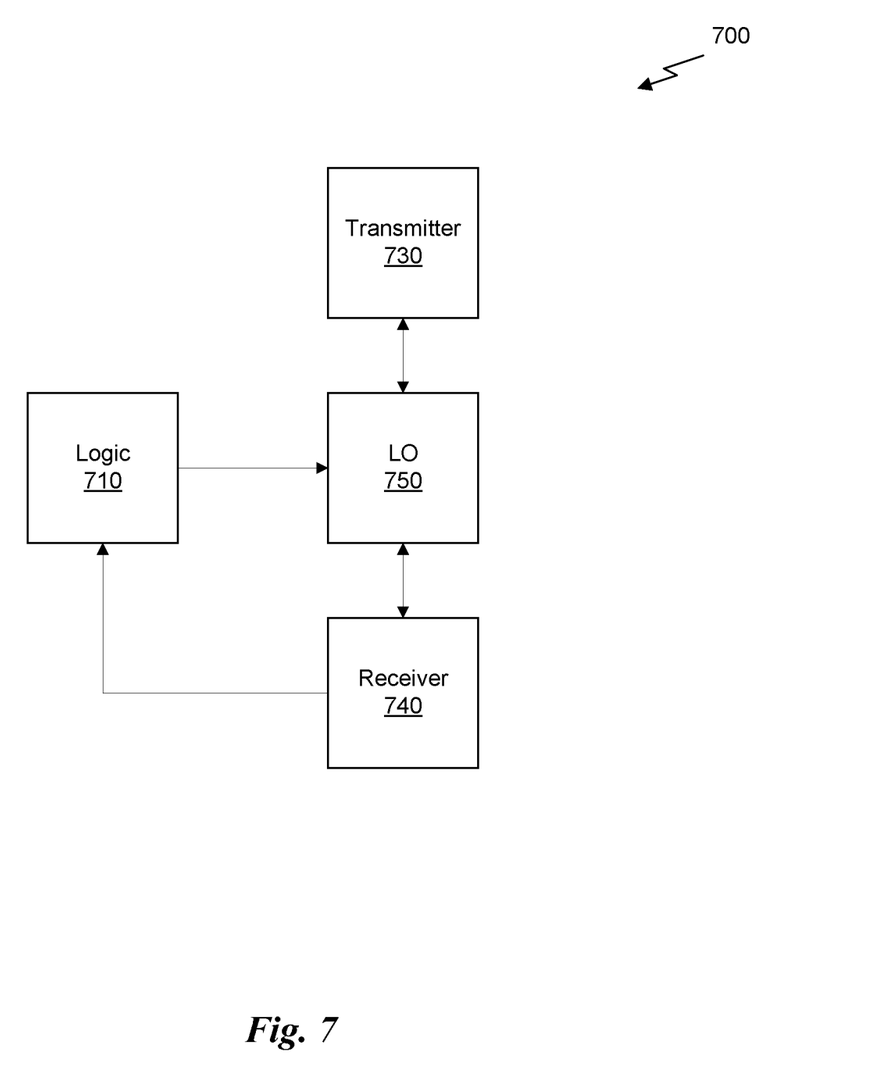
FIG. 7 illustrates a wireless communications system, in accordance with one embodiment.

FIG. 7 illustrates a wireless communications system 700, in accordance with one embodiment. The system 700 includes logic 710, a transmitter 730, a receiver 740, and a local oscillator unit 750. The transmitter 730 provides a means for generating an RF signal to be transmitted wirelessly via an antenna. The receiver 740 provides a means for measuring the RF signal transmitted via the antenna to provide feedback related to the CIM distortion added to the signal by the transmitter 730. The logic 710 provides a means for analyzing the feedback signal measured by the receiver 740 to determine an optimum duty ratio correction factor that specifies an adjust to a duty cycle of the RF signals generated by the LO unit 750. The wireless communications system 700 may be embodied within one or more integrated circuits included in a device, such as a mobile phone, tablet, GPS unit, or other electronic device.

In one embodiment, the logic 710 collects measurement vectors related to a number of pre-defined duty ratio correction factors. The logic 710 calculates a number of estimated optimum duty ratio correction factors based on the collected measurement vector and determines a final optimum duty ratio correction factors based on the estimated optimum duty ratio correction factors.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method for calibrating a wireless transmitter, comprising:
    collecting, via a measurement receiver associated with the wireless transmitter, measurement data corresponding to a number of pre-defined duty ratio correction factors;
    calculating, during a first iteration, two estimated optimum duty ratio correction factors based on a first subset of the measurement data;
    calculating, during a second iteration, four estimated optimum duty ratio correction factors based on a second subset of the measurement data;
    determining a final optimum duty ratio correction factor from the six estimated optimum duty ratio correction factors; and configuring a local oscillator unit associated with the wireless transmitter based on the final optimum duty ratio correction factor, wherein a duty ratio correction factor refers to a parameter that identifies an adjustment to a duty cycle of one or more radio frequency (RF) signals generated by the local oscillator unit for the wireless transmitter.

2. The method of claim 1, wherein the number of pre-defined duty ratio correction factors is four.

3. The method of claim 2, wherein a first pre-defined duty ratio correction factor, $x_1$, is equal in magnitude and opposite in sign to a second pre-defined duty ratio correction factor, $x_2$ (i.e., $x_2=-x_1$), and a third pre-defined duty ratio correction factor, $x_3$, is less than the first pre-defined duty ratio correction factor, $x_1$, and greater than a fourth pre-defined duty ratio correction factor, $x_4$, which is equal to zero (i.e., $x_1 > x_3 > x_4 = 0$).

4. The method of claim 1, wherein calculating, during the first iteration, two estimated optimum duty ratio correction factors based on the first subset of the measurement data comprises:

calculating a difference between a first measurement vector associated with a first pre-defined duty ratio correction factor, $x_1$, and a second measurement vector associated with a second pre-defined duty ratio correction factor, $x_2$; and calculating a difference between the first measurement vector associated with the first pre-defined duty ratio correction factor, $x_1$, and a third measurement vector associated with a third pre-defined duty ratio correction factor, $x_3$.

5. The method of claim 4, wherein calculating, during the second iteration, four estimated optimum duty ratio correction factors based on the second subset of the measurement data comprises:

calculating a difference between the first measurement vector associated with the first pre-defined duty ratio correction factor, $x_1$, and a fourth measurement vector associated with a fourth pre-defined duty ratio correction factor, $x_4$; and calculating a difference between the second measurement vector associated with the second pre-defined duty ratio correction factor, $x_2$, and the fourth measurement vector associated with the fourth pre-defined duty ratio correction factor, $x_4$.

6. The method of claim 1, wherein determining the final optimum duty ratio correction factor from the six estimated optimum duty ratio correction factors comprises:

calculating a set of difference values including:

a first difference value between a first estimated optimum duty ratio correction factor calculated during the first iteration and a first estimated optimum duty ratio correction factor calculated during the second iteration (i.e., $x_{0n\_2nd\_p} - x_{0n\_1st}$), a second difference value between the first estimated optimum duty ratio correction factor calculated during the first iteration and a second estimated optimum duty ratio correction factor calculated during the second iteration (i.e., $x_{0n\_2nd\_n} - x_{0n\_1st}$), a third difference value between a second estimated optimum duty ratio correction factor calculated during the first iteration and a third estimated optimum duty ratio correction factor calculated during the second iteration (i.e., $x_{0p\_2nd\_p} - x_{0p\_1st}$), and a fourth difference value between the second estimated optimum duty ratio correction factor calculated during the first iteration and a fourth estimated optimum duty ratio correction factor calculated during the second iteration (i.e., $x_{0p\_2nd\_n} - x_{0p\_1st}$); and determining a minimum absolute difference value based on a magnitude of the first difference value, a magnitude of the second difference value, a magnitude of the third difference value, and a magnitude of the fourth difference value.

7. The method of claim 1, wherein configuring the local oscillator unit associated with the wireless transmitter based on the final optimum duty ratio correction factor comprises writing a value of the final optimum duty ratio correction factor to a register associated with the local oscillator unit.

8. The method of claim 1, wherein the wireless transmitter, the local oscillator unit, and the measurement receiver are included in a transceiver implemented on an integrated circuit.

9. The method of claim 1, wherein the wireless transmitter and the measurement receiver are configured to operate using in-phase quadrature (IQ) modulation.

10. A wireless communications system, comprising:

a wireless transmitter;

a local oscillator unit configured to provide radio-frequency signals to the wireless transmitter;

a measurement receiver configured to collect measurement data associated with the signals transmitted by the wireless transmitter; and logic included in an integrated circuit, the logic configured to:

collect, via the measurement receiver, measurement data corresponding to a number of pre-defined duty ratio correction factors, calculate, during a first iteration, two estimated optimum duty ratio correction factors based on a first subset of the measurement data, calculate, during a second iteration, four estimated optimum duty ratio correction factors based on a second subset of the measurement data, determine a final optimum duty ratio correction factor from the six estimated optimum duty ratio correction factors, and configure the local oscillator unit based on the final optimum duty ratio correction factor, wherein a duty ratio correction factor refers to a parameter that identifies an adjustment to a duty cycle of one or more radio frequency (RF) signals generated by the local oscillator unit for the wireless transmitter.

11. The system of claim 10, wherein the number of pre-defined duty ratio correction factors is four.

12. The system of claim 11, wherein a first pre-defined duty ratio correction factor, $x_1$, is equal in magnitude and opposite in sign to a second pre-defined duty ratio correction factor, $x_2$ (i.e., $x_2=-x_1$), and a third pre-defined duty ratio correction factor, $x_3$, is less than the first pre-defined duty ratio correction factor, $x_1$, and greater than a fourth pre-defined duty ratio correction factor, $x_4$, which is equal to zero (i.e., $x_1 > x_3 > x_4 = 0$).

13. The system of claim 10, wherein calculating, during the first iteration, two estimated optimum duty ratio correction factors based on the first subset of the measurement data comprises:

calculating a difference between a first measurement vector associated with a first pre-defined duty ratio correction factor, $x_1$, and a second measurement vector associated with a second pre-defined duty ratio correction factor, $x_2$; and calculating a difference between the first measurement vector associated with the first pre-defined duty ratio correction factor, $x_1$, and a third measurement vector associated with a third pre-defined duty ratio correction factor, $x_3$.

14. The system of claim 13, wherein calculating, during the second iteration, four estimated optimum duty ratio correction factors based on the second subset of the measurement data comprises:
calculating a difference between the first measurement vector associated with the first pre-defined duty ratio correction factor, $x_1$, and a fourth measurement vector associated with a fourth pre-defined duty ratio correction factor, $x_4$; and
calculating a difference between the second measurement vector associated with the second pre-defined duty ratio correction factor, $x_2$, and the fourth measurement vector associated with the fourth pre-defined duty ratio correction factor, $x_4$.

15. The system of claim 10, wherein determining the final optimum duty ratio correction factor from the six estimated optimum duty ratio correction factors comprises:
calculating a set of difference values including:
a first difference value between a first estimated optimum duty ratio correction factor calculated during the first iteration and a first estimated optimum duty ratio correction factor calculated during the second iteration (i.e., $x_{On\_2nd\_p} - x_{On\_1st}$),
a second difference value between the first estimated optimum duty ratio correction factor calculated during the first iteration and a second estimated optimum duty ratio correction factor calculated during the second iteration (i.e., $x_{On\_2nd\_n} - x_{On\_1st}$),
a third difference value between a second estimated optimum duty ratio correction factor calculated during the first iteration and a third estimated optimum duty ratio correction factor calculated during the second iteration (i.e., $x_{Op\_2nd\_p} - x_{Op\_1st}$), and
a fourth difference value between the second estimated optimum duty ratio correction factor calculated during the first iteration and a fourth estimated optimum duty ratio correction factor calculated during the second iteration (i.e., $x_{Op\_2nd\_n} - x_{Op\_1st}$); and
determining a minimum absolute difference value based on a magnitude of the first difference value, a magnitude of the second difference value, a magnitude of the third difference value, and a magnitude of the fourth difference value.

16. The system of claim 10, wherein configuring the local oscillator unit associated with the wireless transmitter based on the final optimum duty ratio correction factor comprises writing a value of the final optimum duty ratio correction factor to a register associated with the local oscillator unit.

17. The system of claim 10, wherein the wireless transmitter, the local oscillator unit, and the measurement receiver are included in a transceiver implemented on an integrated circuit.

18. The system of claim 17, wherein the logic is implemented as a plurality of instructions executed by a processor implemented on a second integrated circuit coupled to the integrated circuit.

19. The system of claim 10, wherein the wireless transmitter and the measurement receiver are configured to operate using in-phase quadrature (IQ) modulation.

20. A non-transitory computer-readable media storing computer instructions for calibrating a wireless transmitter that, when executed by one or more processors, cause the one or more processors to perform the steps of:
collecting, via a measurement receiver associated with the wireless transmitter, measurement data corresponding to a number of pre-defined duty ratio correction factors;
calculating, during a first iteration, two estimated optimum duty ratio correction factors based on a first subset of the measurement data;
calculating, during a second iteration, four estimated optimum duty ratio correction factors based on a second subset of the measurement data;
determining a final optimum duty ratio correction factor from the six estimated optimum duty ratio correction factors; and
configuring a local oscillator unit associated with the wireless transmitter based on the final optimum duty ratio correction factor,
wherein a duty ratio correction factor refers to a parameter that identifies an adjustment to a duty cycle of one or more radio frequency (RF) signals generated by the local oscillator unit.

* * * * *